United States Patent [19]

Blanchard et al.

[11] Patent Number: 4,958,204
[45] Date of Patent: Sep. 18, 1990

[54] JUNCTION FIELD-EFFECT TRANSISTOR WITH A NOVEL GATE

[75] Inventors: Richard A. Blanchard, Los Altos; Adrian I. Cogan, San Jose, both of Calif.

[73] Assignee: Siliconix incorporated, Santa Clara, Calif.

[21] Appl. No.: 453,367

[22] Filed: Dec. 21, 1989

Related U.S. Application Data

[63] Continuation of Ser. No. 112,843, Oct. 23, 1987, abandoned.

[51] Int. Cl.$^5$ .............................................. H01L 29/80
[52] U.S. Cl. ...................................... 357/22; 357/23.12
[58] Field of Search ............... 357/23.12, 22 R, 22 C, 357/23.1

[56] References Cited

U.S. PATENT DOCUMENTS

| | | | |
|---|---|---|---|
| 3,442,721 | 5/1969 | McCaldin et al. | 357/23.12 X |
| 3,540,925 | 11/1970 | Athanas et al. | 357/23.12 X |
| 3,624,466 | 11/1971 | Schnable | 357/23.12 |
| 3,852,120 | 12/1974 | Johnson et al. | 357/33.12 X |

OTHER PUBLICATIONS

Sze, S. *Physics of Semiconductor Devices*, 1981, pp. 504–506.
Grove, A. S., *Physics and Technology of Semi-Conductor Devices*, Wiley, 1967, pp. 330–331.
W. Gartner and M. Schulz, "Electronic Conduction Mechanisms of Cs- and B-Implanted SiO$_2$-Films", *Applied Physics*, 12, pp. 137–148.

*Primary Examiner*—Andrew J. James
*Assistant Examiner*—Sara W. Crane
*Attorney, Agent, or Firm*—Skjerven, Morrill, MacPherson, Franklin & Friel

[57] ABSTRACT

A junction field effect transistor (JFET) with a novel gate. The novel gate uses a gate region (19) induced by charged ions (13) located in the gate dielectric layer (12) above the channel region (1). The charged ions (13) that induce the gate region are implanted into the gate dielectric layer (12) and subsequently activated. Both N channel and P channel devices can be produced in this fashion. The invention, unlike conventional JFET's, may be forward biased, and is free of the noise produced by a conventional diffused gate region.

7 Claims, 2 Drawing Sheets

JUNCTION FIELD-EFFECT TRANSISTOR WITH A NOVEL GATE

This application is a continuation of application Ser. No. 07/112,843, filed 10/23/87 now abandoned.

BACKGROUND OF THE INVENTION

1. Field of the Invention

This invention relates to semiconductor devices, and more particularly to junction field effect transistors. Specifically, the invention is a novel gate induced by ions implanted in a dielectric layer overlying the channel.

2. Description of the Prior Art

A typical junction field-effect transistor (JFET), as seen in FIG. 1, consists of a conductive channel region 1, source 4 and drain 6 contacts, and two gate contacts 8 and 9. In some structures, the top and bottom gates, 2 and 3, are physically connected, and only one gate contact is provided. By varying the reverse bias on the gate-to-source contacts 8 and/or 9 to 4, the cross-section of the channel region 1* is adjusted, affecting source to drain resistance. The cross-sectional area and its resistance determine the amount of current that flows through the device. JFETs are well-known devices which, because of their structure and the fabrication techniques used in their manufacture, have the following detrimental characteristics:

1. The gate junction can be reverse biased, decreasing the current through the device. If the gate junction is forward biased, carriers are injected into the channel, damaging the device.

2. The process of forming the gate junction gives rise to a certain amount of undesirable "burst" or "popcorn" noise, which limits the application of the device.

SUMMARY

It is therefore an object of this invention to provide a junction field effect transistor, suitable for either discrete device or large scale integrated circuit manufacture, without the drawbacks of the prior art, namely the vulnerability to forward biasing and the tendency to produce burst noise.

In the preferred embodiment, the present invention achieves this object by creating an induced gate region in the channel region. This is achieved by implanting charged ions such as cesium or boron in a dielectric layer directly above the location of the desired induced gate region. The induced gate region thus provides an induced gate junction in the channel.

DETAILED DESCRIPTION

Figure 2A:
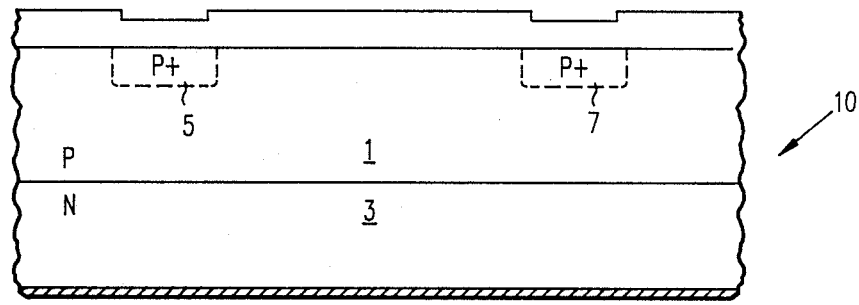
FIG. 2a, 2b, 2c show the fabrication steps to produce the present invention.
Figure 2B:
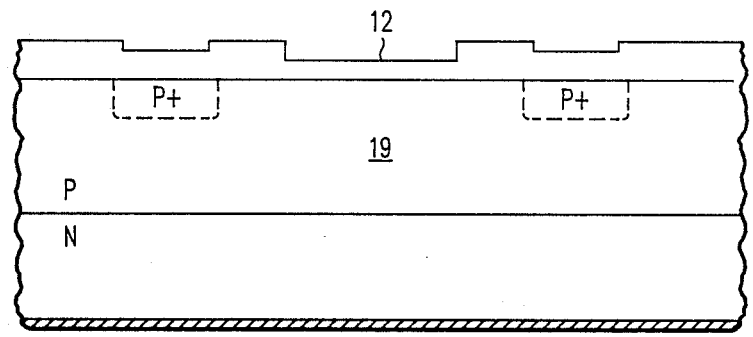
Figure 2C:
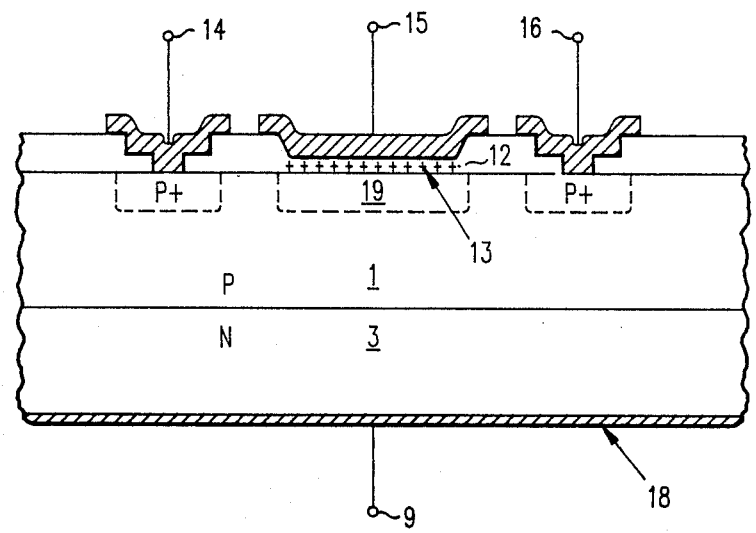

The new JFET structure uses a junction electrically induced by charged ions, the ions being located in the dielectric layer above the channel region These charged ions and their associated dielectric layer together with a conductive gate layer comprise the gate means. The polarity and amount of the charge, the thickness of the dielectric layer between the charge and the channel, and the channel region thickness and doping concentration are optimized to provide the desired device characteristics. The current flow through the device is controlled by gate means provided by a conductive gate region above the charged ions that are in the gate dielectric. Varying the voltage on the gate increases or decreases the thickness of the induced gate junction, which controls the flow of current through the device. A cross-section of this new device at various steps in its fabrication is shown in FIG. 2a, 2b, and 2c.

Figure 1:
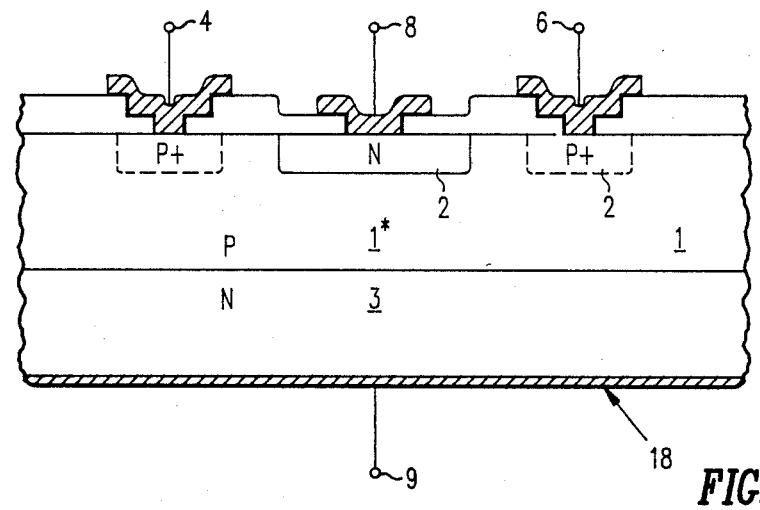
FIG. 1 is a conventional prior art JFET.

Referring to FIG. 1, the prior art JFET requires the fabrication of a gate by placing a P channel region 1 (the channel) between two N gate regions 2 and 3. This is a P channel gate; there are similarly N channel JFET's.

The other features of prior art JFET's are the source contact 4 and source region (P+) 5, the drain contact 6 and drain region (P+) 7. The gate contacts for applying the bias voltages are shown at 8 and 9, with metallization layer 18 on the substrate connected to contact 9.

The present invention is fabricated as follows:

(FIG. 2a) Starting with conventional positively charge epitaxial layer 1 grown on a silicon substrate 3, oxidize, mask, dope and diffuse the epitaxial layer to form the heavily positively doped source region 5 and drain region 7. The source region 5 and drain region 7 are spaced apart and are of the same conductivity type. Epitaxial layer 1 and silicon substrate 3 make up the semiconductor body 10.

(FIG. 2b) Mask and etch down to the epitaxial layer the area above where the induced gate region 19 is to be, then grow a layer of $SiO_2$ as an insulating layer of the appropriate thickness, at 12.

(FIG. 2c) Using conventional photoresist masking techniques, leave the gate area 12 uncovered, while covering the remainder of the device. Introduce the ions 13 (typically boron or cesium) using ion implantation, then strip the photoresist and anneal the wafer to activate the implanted ions. Finally, complete the fabrication sequence, opening contacts 14, 15, 16, and depositing and masking the substrate metallization layer 18, for the second gate contact 9, and also metallizing contacts 14, 15 and 16.

Not shown in FIG. 2 are the techniques used to terminate the channel width. The use of etch techniques, diffusion techniques, or a combination of both are well known to those skilled in the art, and are not shown here.

Figure 3:
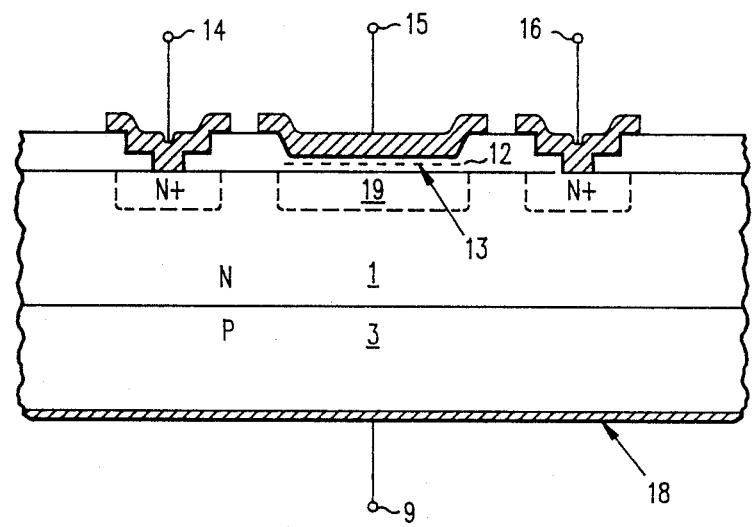
FIG. 3 is the same as 2c, with opposite conductivity types to that of 2c.

The charged ions that induce the gate region are obtained by careful selection of both species implanted into the gate oxide layer and the subsequent activation cycle. As discussed in the article "Electronic Conduction Mechanisms of Cs- and B- implanted $SiO_2$ Films" (W. Gartner and M. Schultz, *Applied Physics*, 12 137-148, 1977), ions such as cesium and boron retain their charge in an $SiO_2$ layer following implantation and an activation cycle. Cesium provides positively charged ions, while boron provides negatively charged ions. Use of these two elements allows fabrication of either N channel or P channel devices. FIG. 2c therefore shows induced gate region 19 which is a depletion region forming an induced gate junction in epitaxial layer 1. FIG. 3 similarly shows induced gate region 19, which is a depletion region forming an induced gate junction in epitaxial layer 1.

This device structure addresses the two issues mentioned earlier in the following fashion:

1. Single polarity gate drive—the dielectric layer between the gate conductive layer and the induced gate region allows the gate voltage to swing to both positive and negative voltages, thus avoiding the possibility of damage to the device from forward biasing.

2. Noise associated with the doping of the gate region—since the gate region is induced, and not created by dopant atoms, any noise associated with the presence of a diffused region is not present.

A preferred embodiment is illustrated above, of which modification and adaptations within the scope of the invention will occur to those skilled in the art. For example, this invention may be practiced using any suitable semiconductor material. Also, the implanted ions may be of elements other than cesium or boron. Additionally, this invention may be used to create a device analogous to a "double-diffused" JFET. In this instance, a region is diffused into silicon and ions are introduced into the gate region below the gate metallization. Last, the conductivity types may be reversed, as shown in FIG. 3, to make an N channel device.

We claim:

1. A junction field effect transistor comprising:
   a semiconductor substrate of a first conductivity type;
   a semiconductor region of a second conductivity type opposite the first conductivity type formed overlying the substrate and having a principal surface;
   a source region of the second conductivity type being more heavily doped than the semiconductor region, and formed in the semiconductor region and extending to the principal surface;
   a drain region of the second conductivity type being more heavily doped than the semiconductor region, and formed in the semiconductor region and extending to the principal surface;
   an insulating layer including charged ions therein overlying a portion of the principal surface between the source region and drain region;
   a first conductive gate electrode overlying the insulating layer; and
   a second conductive gate electrode formed on a surface of the semiconductor substrate;
   whereby application of a voltage to the first and second conductive gate electrode induces a depletion region in a portion of the semiconductor region underlying the insulating layer.

2. The device of claim 1, further comprising that said charged ions are implanted charged ions in said insulating layer.

3. The device of claim 1, further comprising that said charged ions are activated by annealing after said implantation.

4. The device of claim 1, further comprising said charged ions being charged ions of boron.

5. The device of claim 1, further comprising said charged ions being charged ions of cesium.

6. The device of claim 1, wherein said first conductivity type is positive conductivity type.

7. The device of claim 1, wherein said first conductivity type is negative conductivity type.

* * * * *